United States Patent
Graebner et al.

[11] Patent Number: 5,959,388
[45] Date of Patent: Sep. 28, 1999

[54] MAGNETICALLY TUNABLE SURFACE ACOUSTIC WAVE DEVICES

[75] Inventors: John Edwin Graebner, Short Hills; Sungho Jin, Millington; Wei Zhu, Warren, all of N.J.

[73] Assignee: Lucent Technologies Inc., Murray Hill, N.J.

[21] Appl. No.: 08/957,954

[22] Filed: Oct. 27, 1997

[51] Int. Cl.[6] .............................. H01L 41/04; H03H 7/34
[52] U.S. Cl. .................. 310/313 R; 333/201; 310/313 A
[58] Field of Search .......................... 310/313 R, 313 D; 333/193, 194, 195, 201

[56] References Cited

U.S. PATENT DOCUMENTS

| | | | |
|---|---|---|---|
| 3,723,915 | 3/1973 | Adler et al. | 333/152 |
| 3,916,348 | 10/1975 | Toda et al. | 310/313 R |
| 4,078,186 | 3/1978 | Folen et al. | 310/313 A |
| 4,137,470 | 1/1979 | Desormiere et al. | 310/313 R |
| 4,209,759 | 6/1980 | Volluet | 310/313 R |
| 4,342,971 | 8/1982 | Cauncilman et al. | 333/152 |
| 5,260,615 | 11/1993 | Sahshi et al. | 333/201 |
| 5,343,175 | 8/1994 | Davenport | 310/313 R |
| 5,576,589 | 11/1996 | Dreifus et al. | 310/313 A |

FOREIGN PATENT DOCUMENTS 8-237058  9/1996  Japan.

*Primary Examiner*—Nestor Ramirez
*Assistant Examiner*—Peter Medley
*Attorney, Agent, or Firm*—Mathews, Collins, Shepherd & Gould, P.A.

[57] ABSTRACT

In accordance with the invention, the operating frequency of a SAW device is magnetically tuned. In a first embodiment, the SAW device comprises a piezoelectric layer mechanically coupled to a substrate or body of magnetostrictive material. Strains magnetically induced in the magnetostrictive substrate is coupled to the piezoelectric layer, altering the velocity at which it can transmit acoustic waves. In an alternative embodiment, surface waves are directly generated in a magnetostrictive material and the velocity is directly altered by an applied magnetic field.

9 Claims, 5 Drawing Sheets

MAGNETICALLY TUNABLE SURFACE ACOUSTIC WAVE DEVICES

FIELD OF THE INVENTION

This invention relates to surface acoustic wave devices and, in particular, to magnetically tunable surface wave devices particularly useful as tunable high-frequency filters.

BACKGROUND OF THE INVENTION

Surface acoustic wave devices (SAW devices) utilize elastic waves generated along the surface of a piezoelectric layer to perform a variety of useful fulnctions. A typical SAW device comprises a pair of surface wave transducers disposed on a smooth-surfaced piezoelectric layer. The transducers are typically interdigital transducers (IDTs), each comprising a pair of alternating, interpenetrating finger-shaped electrodes. The piezoelectric layer is typically lithium niobate, lithium tantalate or quartz. In operation, a transducer is driven by a radio frequency electrical source (as by applying the source between the electrodes of an IDT) and a surface acoustic wave is launched across the substrate to the second transducer where it is picked up as an RF signal.

Surface acoustic wave devices can be used in a variety of applications including filtering, provision of signal delay and generation of high frequency oscillations. Such devices and their applications are described in greater detail in the following publications, all of which are incorporated herein by reference: C. Hartman el al., *Proceedings of the 37th Annual Frequency Control Symposium*, p. 354 et seq. (1993); R. Weigel et al., *Proceedings of the 1996 IEEE Microwave Theorv and Technology Conf.*, Paper No. WE1A-5, p.413 (June 1996); Y. Taguchi et al., *Proceedings of the 1996 IEEE Microwave Theory and Technology Conf.*, Paper No. WE1A-5, p.417 (June 1996); S. Shikata et al., *Proceedings of the Third International Conf. on Applications of Diamond Films and Related Materials*, NIST Special Publication No. 885, p. 29 (1995) and M. Feldmann et al., *Surface Acoustic Waves for Signal Processing*, Chap. 4 (Artech House, 1989).

One important limitation on SAW devices for telecommunications applications is that they are difficult to tune. A SAW filter, for example, is inherently a narrow bandwidth device with a maximum filtering response at a frequency $f = v_p/\lambda$ where $v_p$ is the acoustic phase velocity of the sound transmitting medium and $\lambda$ represents the geometric spacing of the IDT fingers. Since $v_p$ and $\lambda$ in a conventional SAW device are fixed, such devices operate at a fixed frequency and lack the tunability required for many telecommunications applications. Accordingly, there is a need for a tunable SAW device.

SUMMARY OF THE INVENTION

In accordance with the invention, the operating frequency of a SAW device is magnetically tuned. In a first embodiment, the SAW device comprises a piezoelectric layer mechanically coupled to a substrate or body of magnetostrictive material. Strain magnetically induced in the magnetostrictive substrate is coupled to the piezoelectric layer, altering the velocity at which it can transmit acoustic waves or altering the spacing of the IDT pattern. In an alternative embodiment, surface waves are directly generated in a magnetostrictive material and the velocity is directly altered by an applied magnetic field.

BRIEF DESCRIPTION OF THE DRAWINGS

The advantages, nature and additional features of the invention will appear more fully upon consideration of the illustrative embodiments to be described in the accompanying drawings. In the drawings:

FIG. 1(*b*) is an alternative embodiment of a magnetically tunable SAW device.

It is to b e understood that these drawings are for the purposes of illustrating the concepts of the invention a nd are not to scale.

DETAILED DESCRIPTION

Application of an elastic stress, e.g., a compressive stress S on the sound-propagating medium in the direction of SAW propagat ion, is expected to affect the SAW frequency f by at least three mechanisms:

1. The acoustic velocity $v_p$ generally increases as the atoms are forced closer together and the effective stiffness constants $c_{ij}$ (elastic constants) are slightly increased due to a small quadratic dependence of the strain on applied stress.

2. This increase in stiffness is partially offset by the increase in mass density $\rho$, which varies only linearly with the stress.

3. The wavelength $\lambda$ defined by the IDT finger spacing on the substrate decreases as the substrate is compressed in length.

The effect on f of these three mechanisms can be observed by writing $$f = \frac{v_p}{\lambda} = (c_{ij}/\rho)^{1/2}/\lambda,$$

or $$v_p = (c_{ij}/\rho)^{1/2}$$

and the dependence of SAW frequency on stress S is given by $$\frac{1}{f}\frac{\partial f}{\partial S} = \frac{1}{2}\frac{1}{c_{ij}}\frac{\partial c_{ij}}{\partial S} - \frac{1}{2}\frac{1}{\rho}\frac{\partial \rho}{\partial S} + \frac{1}{\lambda}\left|\frac{\partial \lambda}{\partial S}\right|$$

The last two terms are equal and opposite except for the factor of ½. Therefore if the stiffness constants increase with compressive stress, which is the usual case, the SAW frequency will also increase with compressive stress. In the inventive device, the sound-propagating medium is controllably stressed via its attachment onto a magnetostrictive element which expands or contracts when a magnetic field is applied. The extent of stress (and strain) in the magnetostrictive element, and hence in the sound-propagating medium, is controlled by the magnitude of the applied field. The SAW frequency is thus tunable by adjusting the magnetic field.

Figure 1A:
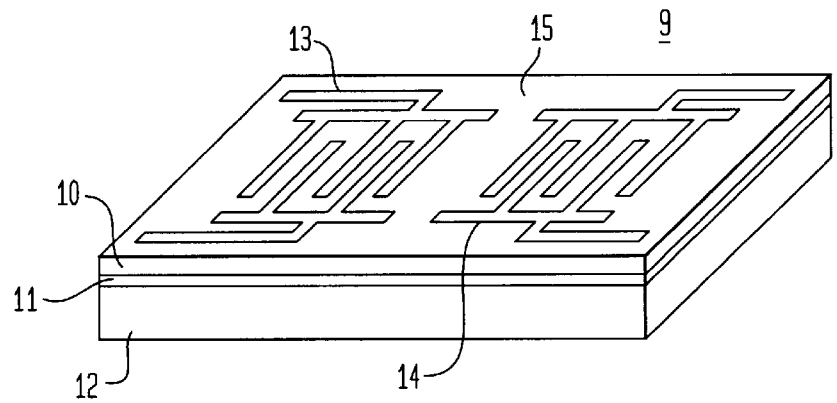
FIG. 1(*a*) is a perspective view of a magnetically tunable SAW device.

Referring to the drawings, FIG. 1(a) is a perspective view of a magnetically tunable SAW device 9 comprising a layer 10 of piezoelectric material mechanically coupled, as by an adhesive bonding layer 11, to a substrate 12 of magnetostrictive material. A pair of surface wave transducers 13, 14, such as spaced apart IDT electrodes, are coupled to a smooth surface 15 of layer 10. The bonding layer 11 is typically epoxy.

The electrodes 13, 14 typically comprise electrodes with a thickness in the range 0.05 to 100 micrometers. The width and spacing of the interdigitated electrode pattern are typically in the range 0.1 to 100 micrometers, depending on the desired operating frequency.

Figure 1B:
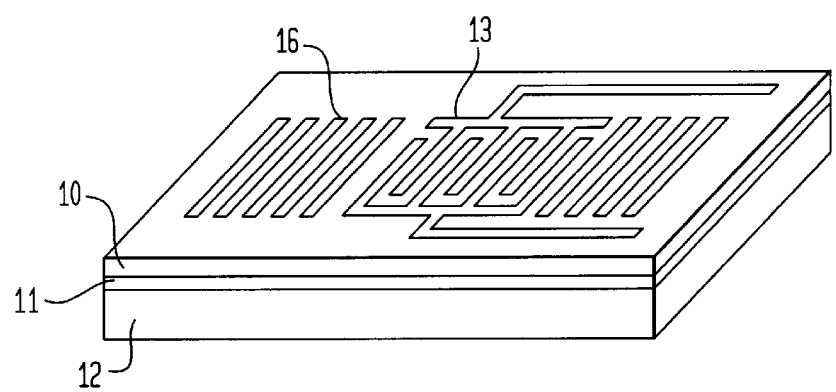

Instead of the transversal filter type SAW device of FIG. 1(a), a resonant type SAW illustrated in FIG. 1(b) can also be utilized. Here there is only a single set of IDT fingers 13, and parallel reflector gratings 16 are added.

The piezoelectric layer 10 is preferably lithium niobate, lithium tantalate or quartz. The desired thickness of the layer depends on the operating frequency and the wavelength of the acoustic waves. The thickness is desirably at least as thick as the acoustic wavelength. For gigahertz signals, the desired thickness is in the range 0.1 to 2000 micrometers and preferably 1 to 500 micrometers.

The magnetostrictive substrate is at least five times thicker than the piezoelectric layer and preferably ten times thicker. Typical thicknesses are in the range 10–20,000 micrometers and preferably 20–500 micrometers.

The magnetostrictive substrate 12 is a ferromagnetic or ferrimagnetic material which expands or contracts in length when an externally applied magnetic field magnetizes the material by aligning internal magnetic domains. The degree of alteration in length can be varied by application of short duration pulses from a source of pulsed current (not shown).

The magnetostriction can be either positive (an increase in length) or negative (a decrease in length) depending on the type of magnetic material used. Some exemplary suitable materials for negative magnetostriction along with their saturation strain ($\epsilon_s$) are $\epsilon_s \sim -38 \times 10^{-6}$ for nickel, $-50 \times 10^6$ for cobalt, and $-2340 \times 10^{-6}$ for $SmFe_2$. Examples of materials for positive magnetostriction are $\epsilon_s \sim +33 \times 10^{-6}$ for an Fe-20 weight % Ni alloy, $+130 \times 10^{-6}$ for a 70% Co-30% Fe alloy, $+61 \times 10^{-6}$ for an Fe-30% Cr-15% Co alloy, $+36 \times 10^{-6}$ for Alnico 5 alloy, $+32 \times 10^{-6}$ for $Fe_3O_4$ ferrite, $+2600 \times 10^{-6}$ for $TbFe_2$, and $+1100 \times 10^{-6}$ for $Tb_{0.28}Dy_{0.72}Fe_2$ alloy. The magnitude of the magnetostriction, as well as its field-dependent behavior, varies somewhat with the material composition and processing. Further details concerning these magnetostrictive materials, are set forth in R. M. Bozorth, *Ferromagnetism*, Chapter 13, p. 647–649 and p. 663–669 (Van Nostrand, New York, 1951); A. E. Clark, *AIP Conference Proc. No.* 18. p. 1015 (New York, 1974); and W. R. Jones, *IEEE Trans. Magn.*, Vol. MAG-17, p. 1459 (1981).

Figure 2:
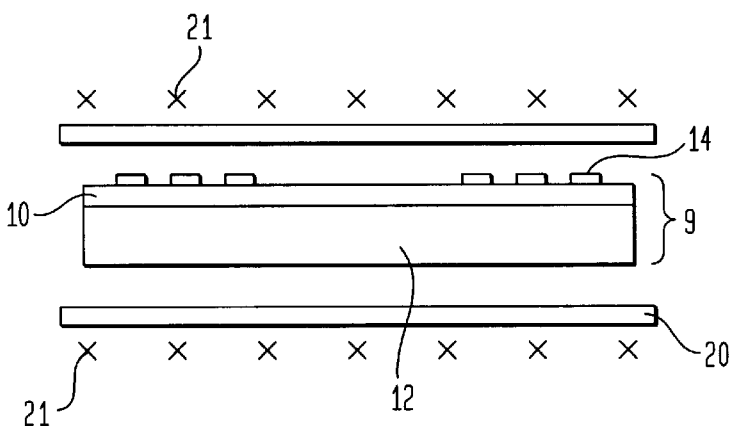
FIG. 2 shows the device of FIG. 1 disposed within a solenoid.

FIG. 2 is a schematic cross section showing the device 9 disposed within a solenoid 20 of conductive wire 21 for magnetically tuning the device operating frequency. In operation a controllable magnetic field (DC bias field) is applied to the device and then removed. The DC bias field magnetizes the magnetostrictive substrate 12 to a certain degree of remanent magnetization with corresponding dimensional expansion or contraction. The dimensional change, in turn, causes elastic strain on the attached piezoelectric layer 10 with an accompanying change in acoustic velocity ($v_p$) in the layer, and also a slight change in the IDT finger spacing ($\lambda$). The filtering frequency ($f = v_p/\lambda$) is then proportionally altered. Thus the device is magnetically tunable.

Figure 3:
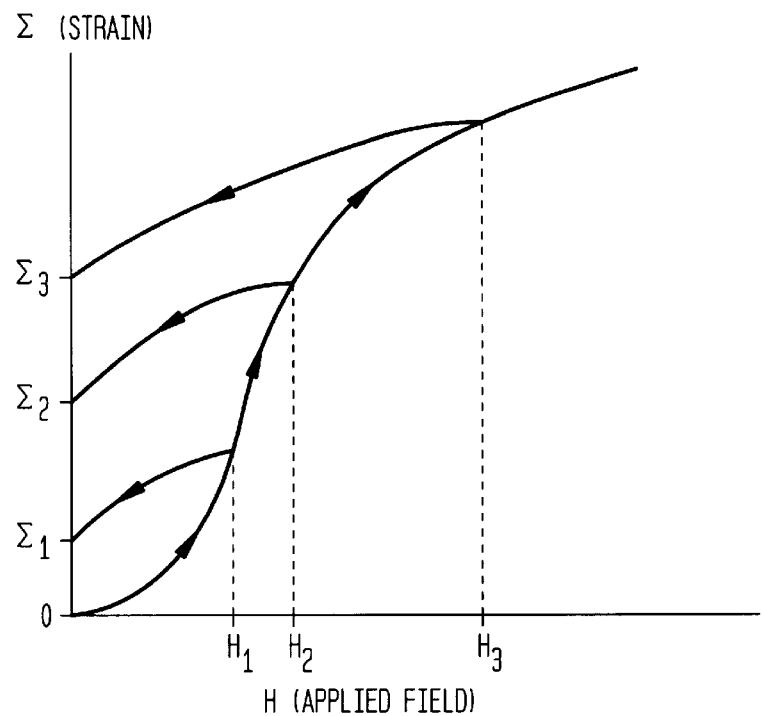
FIGS. 3 and 4 are qualitative graphical plots showing relationships between applied magnetic fields and the magnetostrictive strain.

FIG. 3 is a qualitative graphical plot of the magnetostrictive strain $\epsilon$ as a function of the applied magnetic field H. As can be seen, there is a left-over magnetostrictive strain after the field is removed. The remanent strains for the field strengths $H_1$, $H_2$, and $H_3$ are $\epsilon_1$, $\epsilon_2$, and $\epsilon_3$, respectively. The magnitude of this remanent strain depends on the magnitude of the applied field. Thus the remanent strain is programmable by selecting a proper field strength. For a magnetostrictive straining device with a latching capability, the magnetostrictive material advantageously has semi-hard or permanent magnetic properties rather than soft magnetic properties. The desired coercivity ($H_c$) of the magnetostrictive material is at least 20 Oe, preferably at least 100 Oe.

Figure 4:
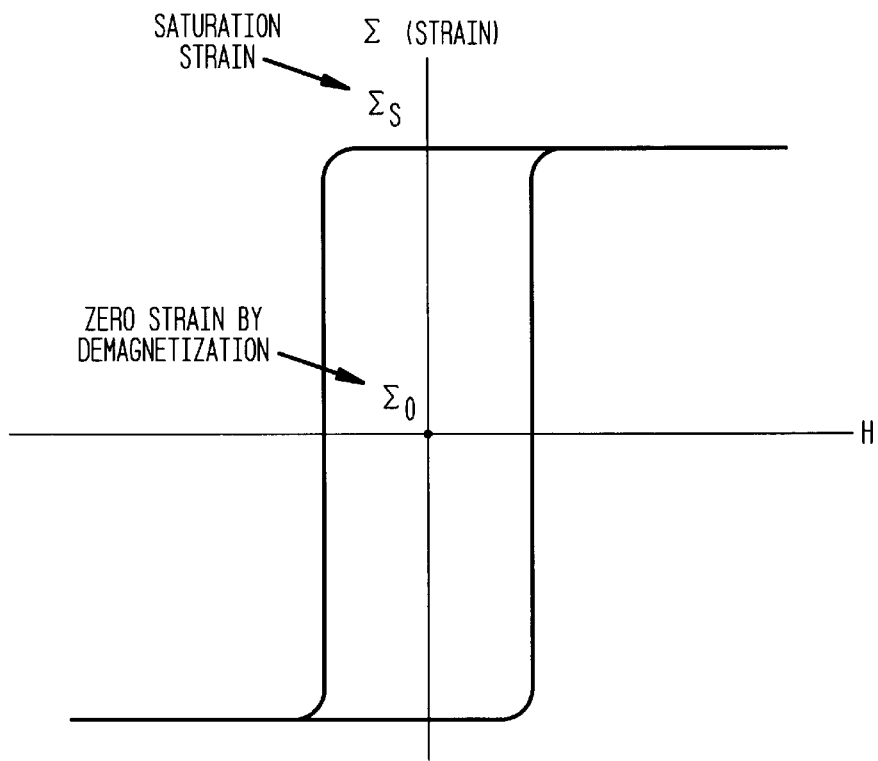

FIG. 4 is a qualitative plot of the magnetostrictive strain $\epsilon$ vs applied field H for a cyclic variation showing a typical square hysteresis loop. Such behavior is useful to produce a bistable device, where the magnetization and demagnetization cause switching between two SAW frequencies $f_1$ and $f_2$. Once the magnetizing field is removed, most of the saturation magnetization and saturation strain $\epsilon_s$ is retained, giving rise to a latchable strain. The magnetostrictive material can be brought back to the zero strain by demagnetizing with a DC field having suitable intensity in the reverse direction (opposite polarity) or with an AC field gradually diminishing in amplitude. Optionally, partial demagnetizing with an AC or a reverse DC field can be used to obtain any desired intermediate remanent strain.

The use of a pulse field is desirable to avoid the continuous use of electrical power. The speed of pulse magnetization can be typically in the range of $1-10^{-8}$ sec, and is preferably $10^{-2}-10^{-6}$ sec. The amplitude of the pulse magnetizing field is preferably in the range of 50–50,000 Oe, depending on the coercivity and the shape of the magnetization curve for the magnetostrictive material. An important advantage of the devices is that continuous power is not required to maintain the shift in SAW frequencies. The magnetostrictive material for the latchable SAW device desirably has a square M-H magnetization loop with the squareness ratio $M_r/M_s$ (remanence/saturation) of at least 0.85, preferably at least 0.90, even more preferably at least 0.95. The desired coercivity is at least 10 Oe and preferably 30 Oe, but is less than 1000 Oe, preferably below 200 Oe for ease of magnetization and demagnetization. While less preferable, the operation of these inventive devices can also be performed with continuous power to maintain the magnetic field applied.

Figure 5:
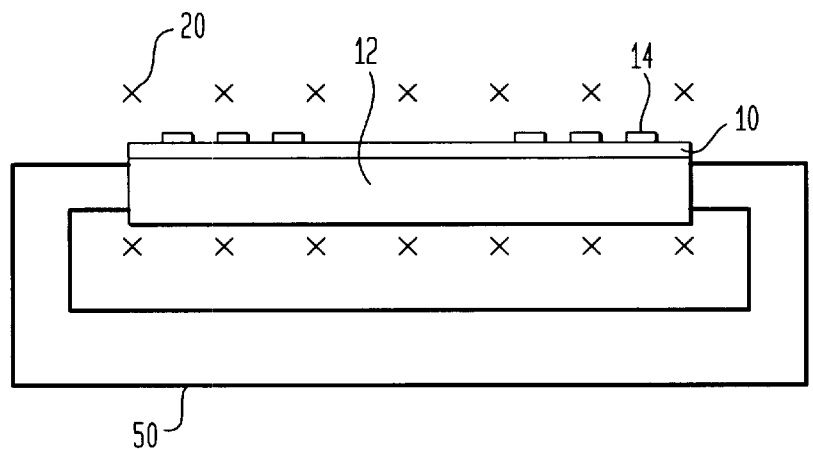
FIG. 5 illustrates a modification of the FIG. 1 device wherein a magnetic flux return path connects opposing ends of the magnetostrictive substrate.

FIG. 5 illustrates a modification of the FIG. 1 embodiment wherein a magnetic flux return path 50 connects the opposing ends of the magnetostrictive substrate 12 in order to reduce flux leakage and thus provide the maximum use of available magnetization. The flux return path 50 is preferably made of iron or a high saturation, high permeability, soft magnetic alloy.

Figure 6:
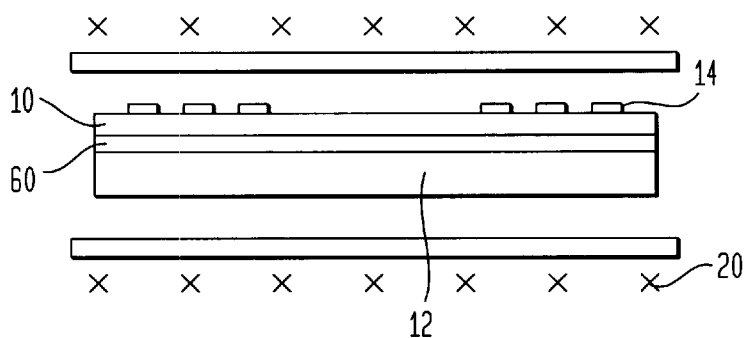
FIG. 6 shows a second modification wherein an additional layer of sound transmitting material is coupled to the piezoelectric layer.

FIG. 6 is a second modification wherein an additional layer 60 of sound-transmitting material is coupled to the piezoelectric layer. Preferably layer 60 is of a high acoustic velocity material such as diamond or sapphire to increase the frequency of device operation at a given IDT spacing or to permit a larger IDT spacing at a given frequency. The acoustic velocity of the added layer 60 or the IDT finger spacing can be tuned using the expansion or contraction of the attached magnetostrictive substrate 12. Alternatively, layer 60 can be a magnetic sound-transmitting material, such as nickel. In this event, the applied magnetic field directly modifies the acoustic velocity in the magnetic material and magnetostrictive straining is no longer the sole mechanism of tuning.

Figure 7:
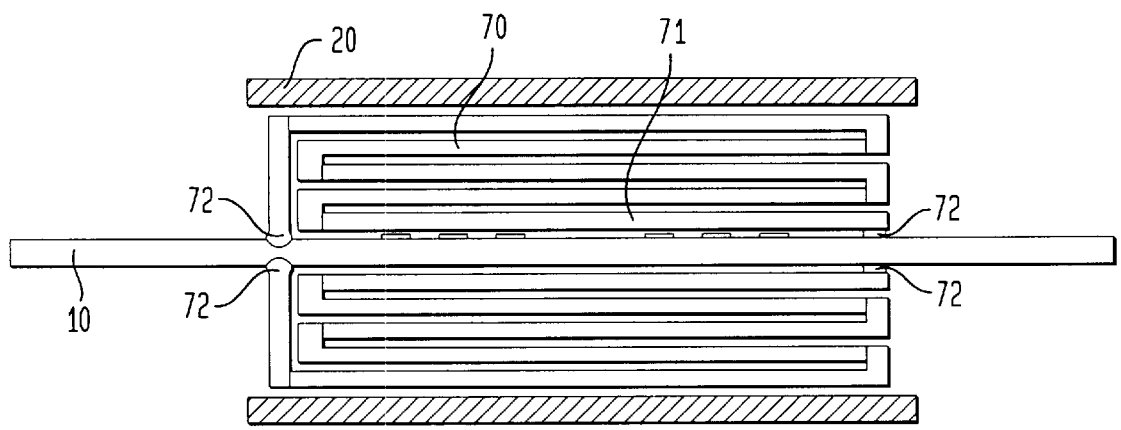
FIG. 7 shows a modification for amplifying the magnetostrictive strain applied to the piezoelectric layer.

For certain materials, the magnitude of magnetostriction may not be sufficient to induce enough dimensional changes in the sound-transmitting medium. FIG. 7 shows an embodiment for mechanically amplifying the magnetostrictive strain using a stack of non-magnetostrictive layers 70 interconnected to magnetostrictive layers 71 to effectively increase their length. Alternating magnetostrictive layers 71 and non-magnetic rigid support layers 70 are interconnected so that opposite ends of the magnetostrictive layers are connected to one another. The alternating layers 70, 71 are mechanically coupled to the piezoelectric layer 10, as by bonding regions 72, so that magnetostrictive strain from the alternating layers are accumulated to produce amplified strain on the attached sound-transmitting medium. For example, an assembly consisting of 10 magnetostrictive layers of 70% Co-30% Fe alloy ($\epsilon_s \sim +130 \times 10^{-6}$) will give a total tensile strain of about $1300 \times 10^{-6}$ or 0.13% change in dimension.

Figure 8:
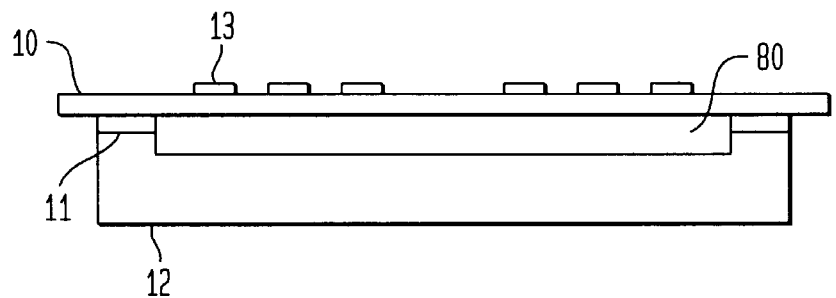
FIGS. 8, 9 and 10 show modifications providing gaps for reducing unwanted capacitance.
Figure 9:
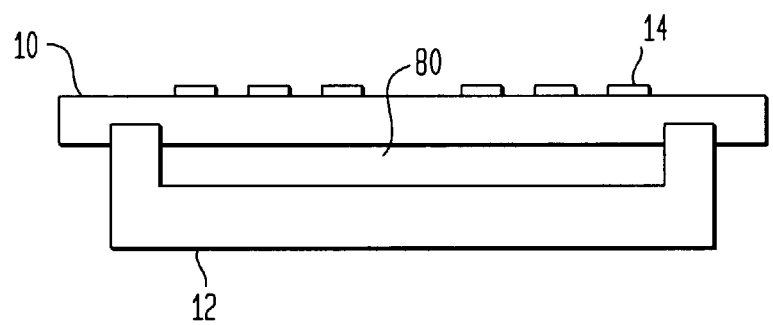
Figure 10:
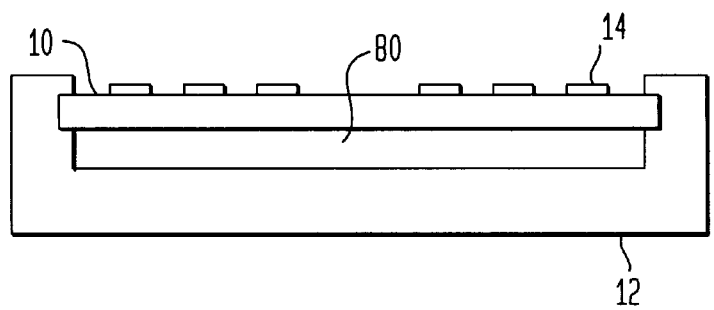

If the magnetostrictive component is made of electrically insulating or poorly-conducting material such as $Fe_3O_4$ or $CoFe_2O_4$, then there is little concern about possible interference from the capacitance between the metallic IDT and the magnetostrictive component. If, however, a metallic (electrically conductive) magnetostrictive component is used, then the capacitance may become an issue. In such event, it is desirable to minimize the effect by increasing the gap between the two metallic components (between the IDT and the metallic magnetostrictive component). FIGS. 8, 9 and 10 schematically illustrate configurations that provide a capacitance-reducing gap 80 yet allow the transfer of the induced magnetostrictive strain to the sound-transmitting medium 10. The magnetostrictive body 12 is attached onto the sound-transmitting medium 10 at outside locations well away from the IDT locations. The field generating solenoids (not shown) may be wound directly around the magnetostrictive component, or alternatively, wound around the assembled structure.

Figure 11:
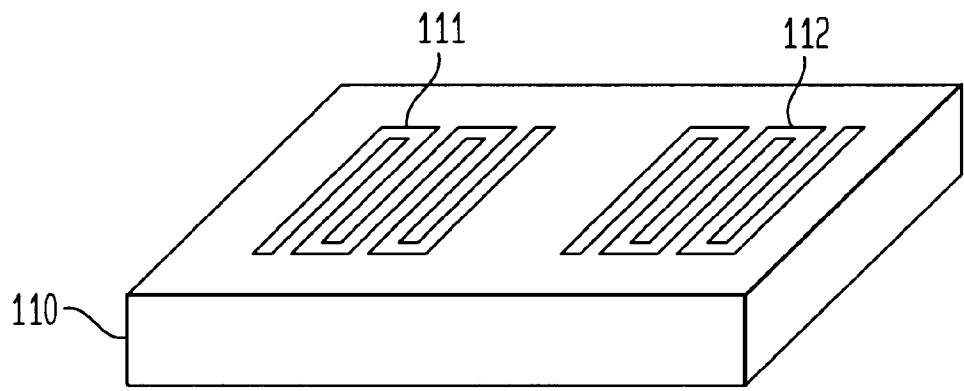
FIG. 11 schematically illustrates an alternative embodiment of a magnetically tunable SAW device wherein a magnetostrictive layer is substituted for the piezoelectric layer.

Instead of using the piezoelectric actuation, acoustic waves can also be generated by a magnetorestrictive method using an AC magnetic field, and a SAW device can be constructed accordingly. FIG. 11 illustrates such an alternative embodiment of a magnetically tunable SAW device 109 in which a layer 110 of ferromagnetic (or ferrimagnetic) material, preferably with a large magnetostriction, is substituted for the piezoelectric layer 10. The acoustic velocity in the magnetic medium and hence the SAW frequency is controlled by applying a bias DC magnetic field which is desirably in the range of 0–5000 Oe and preferably 0–1000 Oe. Such a bias field can be applied either by solenoid or by movable magnets or more conveniently by using the remanent induction from semi-hard magnets with square M-H loop. The latter is particularly desirable, as the latchability makes continuous power use unnecessary. In addition, non-penetrating meander electrodes 111, 112 are substituted for interpenetrating IDT electrodes 13, 14 (shown in previous figures) to apply a local magnetic field and to receive the transmitted signal, respectively.

Figure 12:
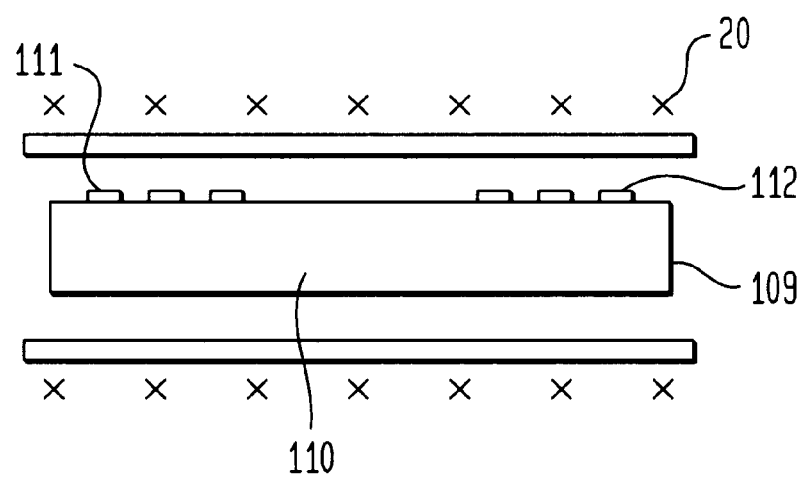
FIG. 12 is a schematic diagram usefull in explaining the operation of the FIG. 11 device.

The operation of this device is schematically illustrated in FIG. 12. The device 109 is disposed within solenoid 20 and subjected to a DC bias field, the magnitude of which is controlled for frequency tuning. A small-amplitude field $\Delta H$ is cyclically applied by the electrode 111 to excite a SAW wave in the magnetostrictive medium 110. The meander coil electrode 111 generates a local magnetic field when an electrical current is applied, and as a result excites a spatially periodic stress in the magnetostrictive medium. By matching the period of this stress to the wavelength of a Rayleigh (surface) wave, a constructive interference of the wavelets launched by the individual elements of the transducer 111 occurs and maximum efficiency is achieved. This happens when the transducer is driven at a frequency $f=v_p/\lambda$ where $v_p$ is the acoustic phase velocity and $\lambda$ is the period of the electrode.

The electrodes 111, 112 can be constructed by physical, chemical or mechanical deposition (e.g. sputtering, electrodeposition or adhesive-bonding) of an electrically conductive layer, such as a Cu or Al layer, on top of an insulating layer. Patterning can be done by well-known procedures such as photolithography.

A further improvement is to use a magnetostrictive medium which also has the characteristics of a square M-H loop and semi-hard magnet properties. The desired loop squareness defined as $M_r/M_s$ (remanent induction/saturation magnetization) is at least 0.85, preferably at least 0.90, even more preferably at least 0.95. The desired coercivity in order to maintain the remanent magnetization against stray field and self demagnetization effect is at least 10 Oe, preferably at least 30 Oe. For ease of magnetization control, the upper limit of the desired coercivity is 1000 Oe, preferably less than 200 Oe. This type of material also shows a plot of the magnetostrictive strain $\epsilon$ vs applied field H for a cyclic variation as a typical square hysteresis loop. Such behavior is useful to produce a bistable device, where the magnetization and demagnetization causes switches between two SAW frequencies $f_1$ and $f_2$. Once the magnetizing field is removed, most of the saturation magnetization and saturation strain s, is retained, giving rise to a latchable strain and hence a latchable change in SAW frequency. The magnetostrictive material can be brought back to the zero strain by demagnetizing with an AC field gradually diminishing in amplitude. Optionally, partial demagnetizing with an AC or a reverse DC field can be used to obtain any desired intermediate remanent strain.

The use of a pulse field is desirable to avoid the continuous use of electrical power. The speed of pulse magnetization can be typically in the range of $1–10^{-8}$ sec, and is preferably $10^{-2}–10^{-6}$ sec. The amplitude of the pulse magnetizing field is preferably in the range of 50–50,000 Oe, depending on the coercivity and the shape of the magnetization curve for the magnetostrictive material.

The degree of tuning by altering the bias magnetic field is dependent on the sensitivity of acoustic velocity of the magnetic medium to the change in its magnetization as well as on the degree of magnetization. For example, the unmagnetized Ni has the longitudinal acoustic velocity of 5480 meter/sec while the magnetized Ni shows a velocity of 6040 meter/sec. (See CRC Handbook of Chemistry and Physics, CRC Press, Boston, 1991, p. 14–35). This amounts to about an 18% change in acoustic velocity and hence an estimated upper range of frequency tuning in the inventive SAW devices if Ni is used as a sound-transmitting medium. If the medium is not fully magnetized, the change in acoustic velocity and the degree of frequency tuning will be reduced corresponding to the programmed magnetization.

It is to be understood that the above-described embodiments are illustrative of only a few of the many possible specific embodiments which can represent applications of the invention. Numerous and varied other arrangements can be made by those skilled in the art without departing from the spirit and scope of the invention.

What is claimed:

1. A surface acoustic wave filter tunable within the gigahertz range comprising:
   a body of piezoelectric material having a surface and a thickness transverse to said surface in the range 0.1 to 2000 micrometers;
   at least one surface wave transducer coupled to said surface; and
   a body of magnetostrictive material having a surface and a thickness transverse to said surface at least five times thicker than the thickness of said piezoelectric body,
   said body of piezoelectric material bonded onto said body of magnetostrictive material with said surfaces parallel, said magnetostrictive material expanding or contracting with an applied magnetic field, whereby varying an applied magnetic field tunes the operating frequency of said surface acoustic wave filter.

2. A surface acoustic wave device according to claim 1 wherein said magnetostrictive strain is mechanically amplified.

3. A surface acoustic wave device according to claim 1 further comprising a solenoid surrounding said body of magnetostrictive material.

4. A surface acoustic wave device according to claim 1 wherein said body of piezoelectric material is mechanically coupled to said body of magnetostrictive material by adhesive or solder bonding.

5. A surface acoustic wave device according to claim 1 wherein said body of piezoelectric material comprises a layer of piezoelectric material disposed on a layer of material having a high velocity for surface acoustic waves, thereby enhancing the operating frequency of the device.

6. A surface acoustic wave device according to claim 1 wherein said body of piezoelectric material comprises a layer of piezoelectric material disposed on a layer of magnetic material for transmitting surface acoustic waves.

7. A surface acoustic wave device according to claim 1 wherein the tuned frequency is latchable after the applied field is removed.

8. A surface acoustic wave device according to claim 7 wherein the magnetostrictive material has a square M-H loop with a squareness ratio of at least 0.85.

9. A surface acoustic wave device according to claim 1 wherein said body of magnetostrictive material is metallic and in the region underlying said transducer there is a gap of at least 0.1 mm between the piezoelectric body and the body of metallic magnetostrictive material thereby reducing unwanted capacitance.

* * * * *